United States Patent
Nishida et al.

(10) Patent No.: US 9,535,139 B2
(45) Date of Patent: Jan. 3, 2017

(54) MAGNETIC SENSOR

(71) Applicant: Asahi Kasei Microdevices Corporation, Tokyo (JP)

(72) Inventors: Sosuke Nishida, Tokyo (JP); Toshinori Takatsuka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 79 days.

(21) Appl. No.: 14/353,551

(22) PCT Filed: Oct. 25, 2012

(86) PCT No.: PCT/JP2012/006864
§ 371 (c)(1),
(2) Date: Apr. 23, 2014

(87) PCT Pub. No.: WO2013/065266
PCT Pub. Date: May 10, 2013

(65) Prior Publication Data
US 2014/0266183 A1     Sep. 18, 2014

(30) Foreign Application Priority Data
Oct. 31, 2011 (JP) ................. 2011-238701

(51) Int. Cl.
*G01R 33/07* (2006.01)
*H01L 43/04* (2006.01)
(Continued)

(52) U.S. Cl.
CPC ............ *G01R 33/07* (2013.01); *G01R 33/072* (2013.01); *H01L 43/04* (2013.01); *H01L 43/06* (2013.01); *G01R 15/202* (2013.01)

(58) Field of Classification Search
CPC .................................................. G01R 33/07
(Continued)

(56) References Cited

U.S. PATENT DOCUMENTS

2004/0135220 A1   7/2004  Goto
2007/0290682 A1*  12/2007 Oohira et al. ............... 324/251
2011/0068771 A1   3/2011  Ueno et al.

FOREIGN PATENT DOCUMENTS

JP     S43-018226 B1    8/1968
JP     S57-040662 A     3/1982
(Continued)

OTHER PUBLICATIONS

Partial Translation of JP2010249655, Nov. 2010.*
(Continued)

*Primary Examiner* — Bot Ledynh
(74) *Attorney, Agent, or Firm* — Morgan, Lewis & Bockius LLP

(57) ABSTRACT

A magnetic sensor of the present invention includes a Hall-effect sensor configured to detect magnetism and an IC being configured to drive the Hall-effect sensor and perform signal processing therefor and having two or more metal interconnection layers. The Hall-effect sensor and the IC are electrically connected to each other via wire interconnections and sealed in one package. Metal interconnections on the IC to input output voltage of the Hall-effect sensor to a signal processing unit of the IC have a grade-separation junction portion in order to suppress an induced electromotive force which a change in the magnetic flux density externally applied generates at output terminals of the Hall-effect sensor, the wire interconnections connected to output electrode pads of the Hall-effect sensor, and the metal interconnections to input the output voltage of the Hall-effect sensor to the signal processing unit of the IC.

9 Claims, 10 Drawing Sheets

(51) Int. Cl.
*H01L 43/06* (2006.01)
*G01R 15/20* (2006.01)

(58) Field of Classification Search
USPC .......................................................... 324/251
See application file for complete search history.

(56) References Cited

FOREIGN PATENT DOCUMENTS

| | | |
|---|---|---|
| JP | S62-199678 U | 12/1987 |
| JP | 2004-207477 A | 7/2004 |
| JP | 2006-214815 A | 8/2006 |
| JP | 2007-103556 A | 4/2007 |
| JP | 2010249655 A * | 11/2010 |
| JP | 2011-064648 A | 3/2011 |

OTHER PUBLICATIONS

International Search Report issued in corresponding International Patent Application No. PCT/JP2012/006864 dated Jan. 21, 2013.
Notification of Transmittal of Translation of the International Preliminary Report on Patentability and International Preliminary Report on Patentability (IPRP) dated May 15, 2014 (documents cited in the IPRP were cited in the IDS filed on Apr. 23, 2014)—11 pages.

* cited by examiner

FIG.7 OUTPUT RESPONSE WAVEFORM WHEN DIFFERENCE IN LOOP AREA IS 0.169 mm²

MAGNETIC SENSOR

TECHNICAL FIELD

The present invention relates to a magnetic sensor, and more specifically, to a quick-response magnetic sensor used as a current sensor or the like.

BACKGROUND ART

Generally, a Hall-effect sensor that is a magnetic sensor varies its output voltage in proportional to a magnetic flux density. It is well known that the Hall-effect sensor is widely used in a so-called current sensor or the like which measures the amount of current flowing through a conductor because the Hall-effect sensor can detect the magnetic flux density generated in proportional to the current flowing through the conductor by using characteristics of Hall-effect sensor.

Meanwhile, a so-called hybrid automobile is well known, which uses both an internal combustion engine and a motor as its drive source to reduce exhaust gas and improve fuel saving. Such a hybrid automobile is generally equipped with an inverter device configured to convert DC power supplied from an in-vehicle battery into three-phase AC power. The three-phase AC power converted by the inverter device is supplied to the motor which is a power supply target. Moreover, in such a hybrid automobile, a current sensor is attached to a power-supply conductor, such, for example, as a bus bar or a cable, connecting the motor to a power module, such as an IGBT (insulated gate bipolar transistor), using for in the inverter device. Then, this current sensor is used to detect current flowing through the bus bar or cable, and the inverter device controls power to be supplied to the motor based on the detected current. The current sensor is required to respond within about several microseconds because current to the motor needs to be detected and controlled quick and accurately in order to rotate the motor efficiently.

A conventional current sensor includes, as shown for example in FIG. 1 of Patent Literature 1, a conductor through which current to be detected flows, a magnetic core surrounding the conductor and having an air-gap portion, a Hall-effect sensor placed in the air-gap portion of the core, and a substrate. The motor using for a hybrid automobile or the like undergoes a drastic change in current as large as several hundred amperes, and therefore the magnetic flux density applied to the Hall-effect sensor drastically changes, too. In this regard, if there is an interconnection loop in wire interconnections connecting output electrode pads of the Hall-effect sensor to external terminals or in interconnections on the substrate connecting output external terminals of the Hall-effect sensor to a signal processing circuit such as an amplifier, an induced electromotive force of a measurable magnitude is superimposed on the output voltage. Thus, it is well known to suppress the induced electromotive force superimposed on the output voltage by using a method of routing interconnections on a substrate as described in Patent Literature 1.

As shown in Formula 1, it is well-known that an induced electromotive force is generated in proportional to a time derivative of a magnetic flux density B and an area S of a loop traversed by a magnetic flux.

$$V_{induction} = -\frac{d\Phi}{dt} = -S\frac{dB}{dt} \quad \text{(Formula 1)}$$

(Vinduction: induced electromotive force, Φ: magnetic flux, S: area of loop, and B: magnetic flux density)

In this formula, units are as follows: Vinduction [V], Φ [Wb], S [m$^2$], and B [Wb/m$^2$]. It is needless to say that the unit [V] is equivalent to a unit [Wb/s], and the unit [Wb/m$^2$] is equivalent to a unit [T]

It is needless to say that the induced electromotive force is generated in such a direction that current can flow in a direction cancelling a change in a magnetic field applied to the loop. The output voltage of the Hall-effect sensor undergoes overshoot on the rising edge if the direction of the induced electromotive force has the same polarity as the output voltage, and undergoes undershoot on the rising edge if the direction of the induced electromotive force has an opposite polarity to that of the output voltage. Due to any of these induced electromotive forces, a delay occurs before the output voltage can be outputted stably at a desirable voltage, and such a delay leads to output response delay. Generally, an acceptable tolerance of the overshoot and the undershoot for the current sensor is ±10 of the output voltage in a stable state.

Meanwhile, in recent years, a linear Hall-effect sensor IC in which a Hall-effect sensor and an IC including a signal processing unit for the Hall-effect sensor are sealed in one package, as described for example in Patent Literature 2, has been used in order to reduce the number of components constituting the current sensor to reduce the size thereof. Regarding the linear Hall-effect sensor, it is needless to say that a Hall-effect sensor including a conductive layer made of a compound semiconductor with high sensitivity is of course suitable for the linear Hall-effect sensor, because the higher the sensitivity of the Hall-effect sensor is, the higher the resolution of current detection can be.

It is well known that in the linear Hall-effect sensor IC, a Hall-effect sensor chip made of a compound semiconductor and an IC chip configured to drive the sensor chip and perform signal processing therefor are connected to each other by wire interconnections such as Au wires and are sealed in one package.

CITATION LIST

Patent Literature

PTL 1: Japanese Patent Laid-Open No. 2006-214815
PTL 2: Japanese Patent Laid-Open No. 2011-064648

SUMMARY OF INVENTION

Technical Problem

In the magnetic sensor, such as the linear Hall-effect sensor IC, using a Hall-effect sensor made of a compound semiconductor, an induced electromotive force generated in the wire interconnections connecting the Hall-effect sensor and the IC together and the metal interconnections on the IC is amplified several dozens to hundreds of times by an amplifier circuit of a signal processing circuit section of the IC. Against such high amplification, the cancelling method using the interconnection loop formed on the substrate as described in above Patent Literature 1 cannot provide sufficient effect and poses a problem that the induced electromotive force superimposed as noise on the output voltage of the linear Hall-effect sensor IC to lower response performance. To attain the maximum possible effect of cancelling the induced electromotive force, the area of the interconnection loop formed on the substrate has to be increased.

Increasing the area of the interconnection loop produces further problem that increase in the loop area increases the area of the substrate, and in turn, increases the size of the current sensor.

There is also a problem that, since it is extremely difficult to form a minute loop for the interconnections on the substrate, it is difficult to accurately form minute and complex loops equivalent to those formed with the wire interconnections connecting the Hall-effect sensor and the IC together and the metal interconnections on the IC.

The present invention has been made in view of such problems, and has an objective of providing a magnetic sensor including a Hall-effect sensor configured to detect magnetism and an IC configured to drive the Hall-effect sensor and perform signal processing therefor, the Hall-effect sensor and the IC being electrically connected to each other via wire interconnections and sealed in one package, the magnetic sensor suppressing an influence of an induced electromotive force generated by a drastic change in the magnetic flux density and having a quick-response performance required for a current sensor.

Solution to Problem

The present invention has been made to achieve the above objective, and an invention according to claim 1 is a magnetic sensor wherein a Hall-effect sensor configured to detect magnetism, an IC configured to drive the Hall-effect sensor and perform signal processing therefor, and wire interconnections connecting the Hall-effect sensor and the IC together being sealed in one package, comprises a grade-separation junction portion at which at least one of a first metal interconnection and a second metal interconnection crosses itself at different heights or at which the first and second interconnections cross each other at different heights, the first metal interconnection connecting together a positive Hall output electrode pad and the signal processing unit which are placed on the IC, the second metal interconnection connecting together a negative Hall output electrode pad and the signal processing unit which are placed on the IC.

In addition, an invention according to claim 2 is the magnetic sensor according to claim and characterized in that, in two or more loops formed when both output terminals of the Hall-effect sensor, the wire interconnections connected to output electrode pads on the Hall-effect sensor, and the metal interconnections on the IC to input output voltage of the Hall-effect sensor to the signal processing unit of the IC are projected on a plane parallel to a magneto-sensitive surface of the Hall-effect sensor, at least one of these loops is a loop generating an induced electromotive force of the same polarity as that of the output voltage of the Hall-effect sensor, and at least one of the loops is a loop generating an induced electromotive force of an opposite polarity to that of the output voltage of the Hall-effect sensor.

The loops formed by the metal interconnections on the IC are of course controlled with high accuracy by use of photolithography. Thus, the areas of the loops can be accurately controlled.

In addition, an invention according to claim 3 is the magnetic sensor according to any one of claims 1 and 2 and characterized in that a total area of a loop generating an induced electromotive force of the same polarity as that of the output voltage of the Hall-effect sensor is equal to a total area of a loop generating an induced electromotive force of an opposite polarity to that of the output voltage of the Hall-effect sensor.

In addition, an invention according to claim 4 is the magnetic sensor according to any one of claims 1 to 3 and characterized in that an absolute value of a difference [unit: $m^2$] between a total area of a loop generating an induced electromotive force of the same polarity as that of the output voltage of the Hall-effect sensor and a total area of a loop generating an induced electromotive force of an opposite polarity to that of the output voltage of the Hall-effect sensor is not larger than a value [unit: $m^2$] obtained by dividing a product of three values, which are 0.1, a sensitivity of a Hall-effect element [unit: $V \cdot m^2/Wb$], and a maximum magnetic flux density applied [unit: $Wb/m^2$], by a time derivative [unit: $Wb/m^2 \cdot s$] of the magnetic flux density applied.

In addition, an invention according to claim 5 is the magnetic sensor according to any one of claims 1 to 4 and characterized in that one or both of the first metal interconnection and the second metal interconnection placed on the IC and forming a loop generating an induced electromotive force is formed by use of two or more metal interconnection layers.

In addition, an invention according to claim 6 is the magnetic sensor according to any one of claims 1 to 5 and characterized in that a polarity of a total of the induced electromotive forces generated by a change in the magnetic flux density externally applied is the same as the polarity of the output voltage of the Hall-effect sensor.

In addition, an invention according to claim 7 is the magnetic sensor according to any one of claims 1 to 6 and characterized in that it takes 2 μs or less for the output voltage to stabilize after the magnetic flux density applied to the magnetic sensor stabilizes.

Advantageous Effects of Invention

The present invention can provide a magnetic sensor including a Hall-effect sensor configured to detect magnetism and an IC configured to drive the Hall-effect sensor and perform signal processing therefor, and at the state of the Hall-effect sensor and the IC being electrically connected to each other via wire interconnections and sealed in one package, the present invention can achieve the magnetic sensor suppressing an influence of an induced electromotive force generated by a drastic change in the magnetic flux density and having a quick-response performance required for a current sensor.

DESCRIPTION OF EMBODIMENTS

An embodiment of the present invention is described below with reference to the drawings.

Figure 1:
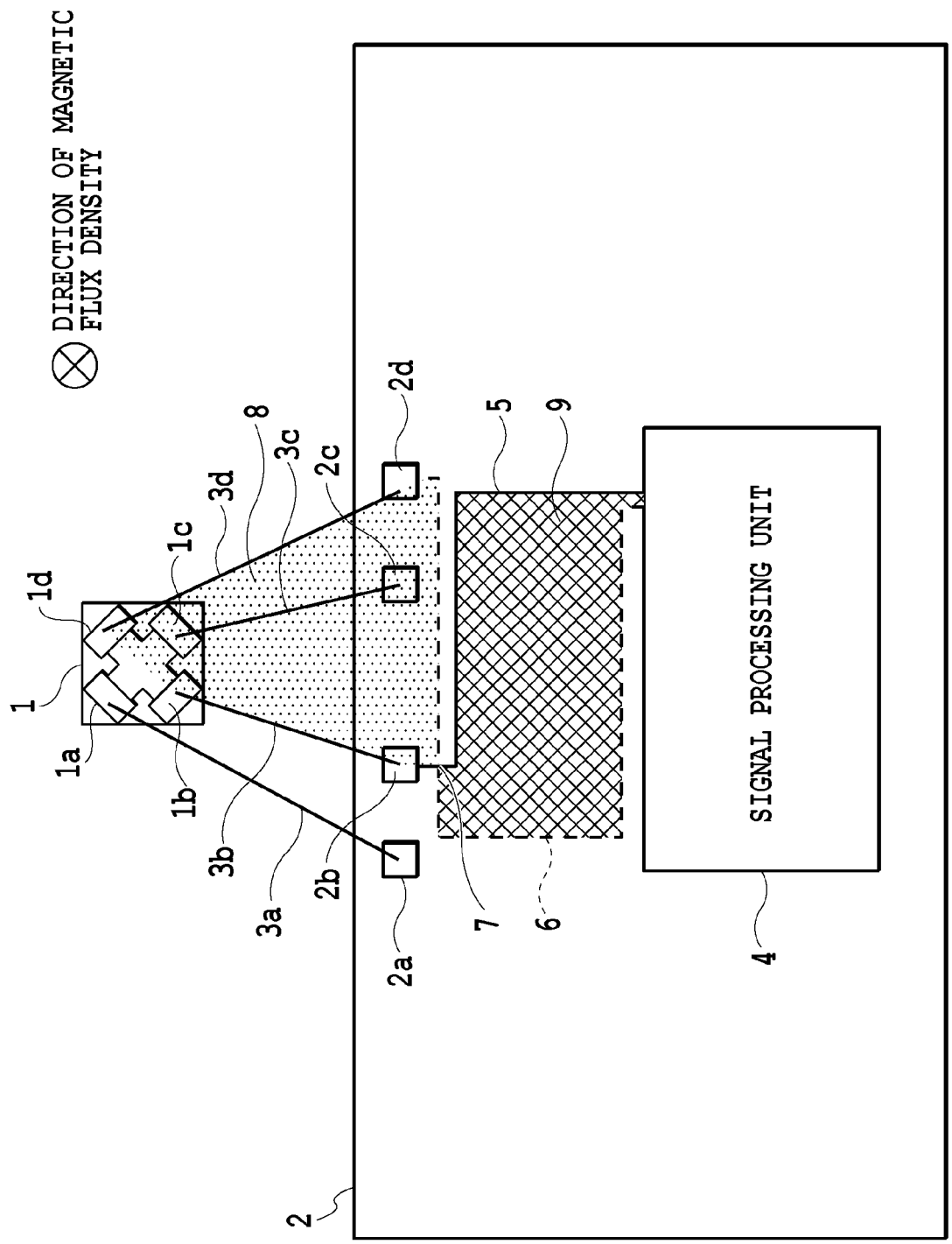
FIG. 1 is a first schematic diagram showing wire interconnections between a Hall-effect sensor and an IC configured to drive the Hall-effect sensor and perform signal processing therefor and also showing metal interconnections on the IC, according to a magnetic sensor of the present invention.

FIG. 1 is a schematic diagram showing wire interconnections between a Hall-effect sensor and an IC configured to drive the Hall-effect sensor and perform signal processing therefor and also showing metal interconnections on the IC, according to a magnetic sensor of the present invention. The magnetic sensor of the present invention has a Hall-effect sensor 1 configured to detect magnetism, an IC 2 configured to drive the Hall-effect sensor 1 and perform signal processing therefor, and wire interconnections 3a to 3d connecting the Hall-effect sensor 1 and the IC 2 together. The IC 2 has two or more metal interconnection layers. The Hall-effect sensor, the IC and the wire interconnections are sealed in one package.

The Hall-effect sensor 1 has a positive input electrode pad 1a, a positive output electrode pad 1b, a negative input electrode pad 1c, and a negative output electrode pad 1d.

On the IC 2, a positive driving electrode pad 2a connected to the positive input electrode pad 1a on the Hall-effect sensor 1, a positive Hall output electrode pad 2b connected to the positive output electrode pad 1b on the Hall-effect sensor 1, a negative driving electrode pad 2c connected to the negative input electrode pad Ic on the Hall-effect sensor I, and a negative Hall output electrode pad 2d connected to the negative output electrode pad 1d on the Hall-effect sensor I are placed.

The wire interconnections connecting the Hall-effect sensor 1 and the IC 2 together consist of the wire interconnection 3a connecting together the positive input electrode pad 1a on the Hall-effect sensor 1 and the positive driving electrode pad 2a on the IC 2, the wire interconnection 3b connecting together the positive output electrode pad 1b on the Hall-effect sensor 1 and the positive Hall output electrode pad 2b on the IC 2, the wire interconnection 3c connecting together the negative input electrode pad 1c on the Hall-effect sensor 1 and the negative driving electrode pad 2c on the IC 2, and the wire interconnection 3d connecting together the negative output electrode pad 1d on the Hall-effect sensor 1 and the negative Hall output electrode pad 2d on the IC 2.

In addition, a signal processing unit 4 configured to perform signal processing on the output from the Hall-effect sensor 1 is placed on the IC 2. Moreover, a first metal interconnection 5 connecting together the positive Hall output electrode pad 2b and the signal processing unit 4 which are placed on the IC 2 and a second metal interconnection 6 connecting together the negative Hall output electrode pad 2d and the signal processing unit 4 which are placed on the IC 2 are placed on the IC 2. Moreover, a grade-separation junction portion, or interchange, 7 is placed on the IC 2. The grade-separation junction portion 7 allows the first metal interconnection 5, which connects together the positive Hall output electrode pad and the signal processing unit that are placed on the IC 2 and the second metal interconnection 6, which connects together the negative Hall output electrode pad and the signal processing unit which are placed on the IC 2 cross to each other at different heights.

The grade-separation junction portion 7 acts as an interchange at which the first metal interconnection 5 and the second metal interconnection 6 cross each other at different heights. The first metal interconnection 5 and the second metal interconnection 6 are for inputting the output voltage of the Hall-effect sensor 1 to the signal processing unit 4 placed on the IC 2. The first metal interconnection 5 and the second metal interconnection 6 are placed on the IC 2. The first metal interconnection 5 and the second metal interconnection 6 are placed in order to suppress an induced electromotive force which a change in the magnetic flux density externally applied generates in a loop. The loop is formed by output terminals on the Hall-effect sensor 1, the wire interconnections 3b, 3d connected to the output electrode pads 1b, 1d on the Hall-effect sensor 1, and the first metal interconnection 5 and the second metal interconnection 6.

A segment connecting together the output terminals of the Hall-effect sensor 1, the wire interconnections 3b, 3d connected to the output electrode pads 1b, 1d on the Hall-effect sensor 1, and the first metal interconnection 5 and the second metal interconnection 6 placed on the IC 2 to input output voltage of the Hall-effect sensor 1 to the signal processing unit 4 placed on the IC 2 are projected on a plane parallel to a magneto-sensitive surface of the Hall-effect sensor 1. Then two or more loops are formed on the plane, and at least one of these multiple loops is a loop generating an induced electromotive force of the same polarity as that of the output voltage of the Hall-effect sensor 1, and at least one of the multiple loops is a loop generating an induced electromotive force of an opposite polarity to that of the output voltage of the Hall-effect sensor 1.

In order for drive current to flow from the positive input electrode pad 1a to the negative input electrode pad 1c on the Hall-effect sensor 1, the positive input electrode pad 1a and the negative input electrode pad 1c are connected to the positive driving electrode pad 2a and the negative driving electrode pad 2d on the IC via the wire interconnections 3a, 3c, respectively. When the magnetic flux density is applied in a direction perpendicular to the paper plane of FIG. 1 from an upper surface of the Hall-effect sensor 1 as shown in FIG. 1, positive Hall-effect output voltage is generated at the positive output electrode pad 1b, and negative Hall-effect output voltage is generated at the negative electrode output pad 1d.

Further, when drive current is passed through the Hall-effect sensor 1 as described above, an area of an interconnection loop 8 contributing to an induced electromotive force of the same polarity as that of the output voltage of the Hall-effect sensor 1, and an area of an interconnection loop 9 contributing to an induced electromotive force of the opposite polarity to that of the output voltage of the Hall-effect sensor 1 are formed.

Meanwhile, the positive Hall output electrode pad 1*b* and the negative Hall output electrode pad 1*d* on the Hall-effect sensor 1 are connected to the positive Hall output electrode pad 2*b* and the negative Hall output electrode pad 2*d* on the IC via the wire interconnections 3*b*, 3*d*, respectively. Further, the positive Hall output electrode pad 2*b* and the negative Hall output electrode pad 2*d* are connected, on the IC, to the signal processing unit 4 via the first metal interconnection 5 and the second metal interconnection 6, respectively. Here, the loop area 8 is an area formed by projecting the wire interconnections 3*b*, 3*d*, the line connecting the output terminals 1*b* and 1*d* on the Hall-effect sensor 1 together, a line on the first metal interconnection 5 on the IC from the positive Hall output electrode pad 2*b* to the grade-separation junction portion 7, and a line on the second metal interconnection 6 on the IC from the negative Hall output electrode pad 2*d* to the grade-separation junction portion 7 on a single plane perpendicular to the magnetic flux density applied (a portion shaded with light dots). Also, the loop area 9 is an area formed by projecting a line on the first metal interconnection 5 from the grade-separation junction portion 7 to an input of the signal processing circuit 4 and a line on the second metal interconnection 6 from the grade-separation junction portion 7 to the input of the signal processing circuit 4 formed by projection on a single plane perpendicular to the magnetic flux density applied (a portion shaded with dark dots). In this regard, on the IC, the first metal interconnection 5 and the second metal interconnection 6 are made to cross each other at different heights at the position of the grade-separation junction portion 7 through multiple metal layers and are also bent, so that the loop area 8 has same area as the loop area 9. In other words, the total area of the loop generating an induced electromotive force of the same polarity as that of the output voltage of the Hall-effect sensor 1 is made to equal the total area of the loop generating an induced electromotive force of the opposite polarity to that of the output voltage of the Hall-effect sensor 1.

It is designed such that an absolute value of a difference between the total area of the loop generating an induced electromotive force of the same polarity as that of the output voltage of the Hall-effect sensor 1 and the total area of the loop generating an induced electromotive force of the opposite polarity to that of the output voltage of the Hall-effect sensor 1 is not larger than a value obtained by dividing the product of three values which are 0.1, the sensitivity of the Hall element, and a maximum magnetic flux density applied by a time derivative of the magnetic flux density applied.

The metal interconnections, on the IC 2, forming the loops generating the induced electromotive forces are each formed by use of two or more metal interconnection layers. Further, the polarity of the total induced electromotive force generated by a change in the magnetic flux density externally applied is the same as that of the output voltage of the Hall-effect sensor 1.

Figure 2:
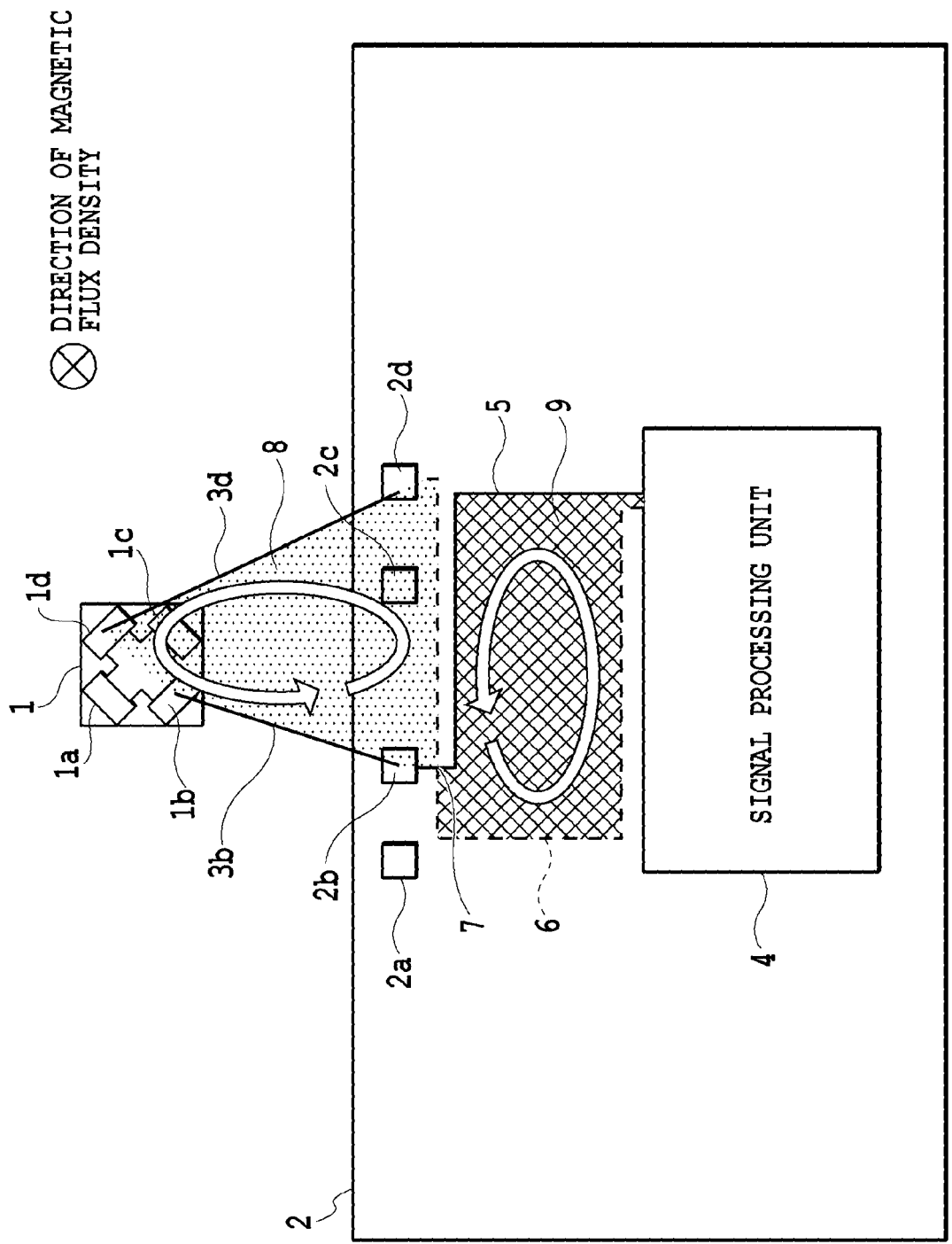
FIG. 2 is a schematic diagram showing, in the interconnection arrangement shown in FIG. 1, the direction of an induced electromotive force generated when the magnetic flux density incrementally changes from a direction at a near side of the paper plane of FIG. 2 to a direction at a far side of the paper plane of FIG. 2.

FIG. 2 is a schematic diagram showing, in the interconnection arrangement shown in FIG. 1, the direction of an induced electromotive force generated when the magnetic flux density incrementally changes from a direction at a near side of the paper plane of FIG. 2 to a direction at a far side of the paper plane of FIG. 2. It can be seen in FIG. 2 that the induced electromotive force generated at the interconnections surrounding the loop area 8 has the same polarity as that of the output voltage of the Hall-effect sensor 1, and the induced electromotive force generated at the interconnections surrounding the loop area 9 has the opposite polarity to that of the output voltage of the Hall-effect sensor 1. Change in the magnetic flux density in the loop area 8 and that in the loop area 9 are generally the same. Thus, if the loop area 8 and the loop area 9 have the same area, the induced electromotive forces cancel each other. It is needless to say that inverting the direction of the magnetic flux density inverts the polarities of the output voltage of the Hall-effect sensor 1 and of each induced electromotive force.

Figure 8:
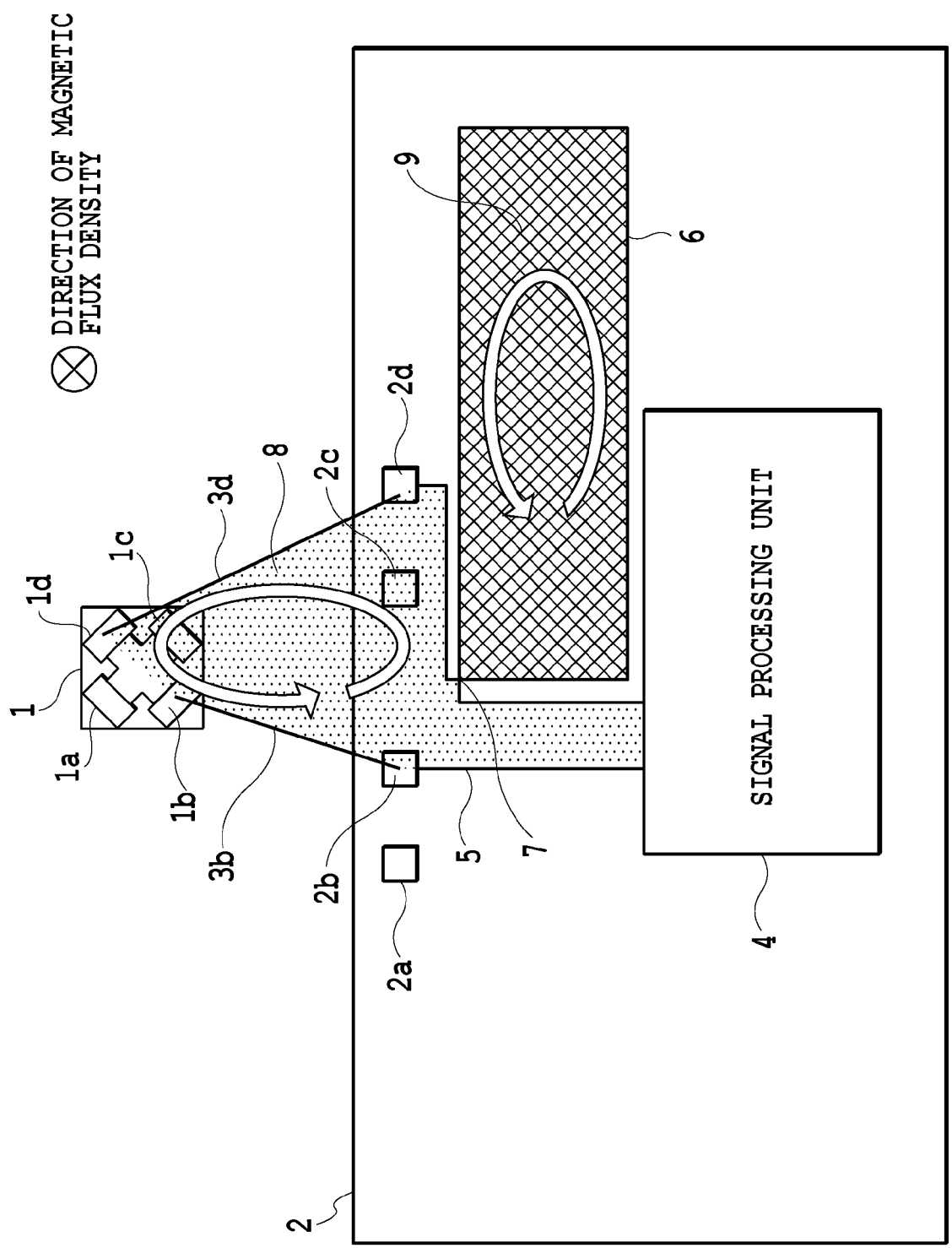
FIG. 8 is a second schematic diagram showing wire interconnections between a Hall-effect sensor and an IC configured to drive the Hall-effect sensor and perform signal processing therefor and also showing metal interconnections on the IC, according to the magnetic sensor of the present invention.

FIG. 8 is a second schematic view showing wire interconnections between a Hall-effect sensor and an IC configured to drive the Hall-effect sensor and perform signal processing therefor and also showing metal interconnections on the IC, according to the magnetic sensor of the present invention. As shown in FIG. 8, the IC may have a grade-separation junction portion 7 at which only the second metal interconnection 6 on the IC crosses itself at different heights. The grade-separation junction portion 7 is a grade-separation junction, or interchange, for forming a loop on the IC for cancelling the induced electromotive force generated at the wire interconnections 3*b*, 3*d* and the like. Of course, the IC may have a grade-separation junction portion 7 at which only the first metal interconnection 5 on the IC crosses itself at different heights.

Figure 9:
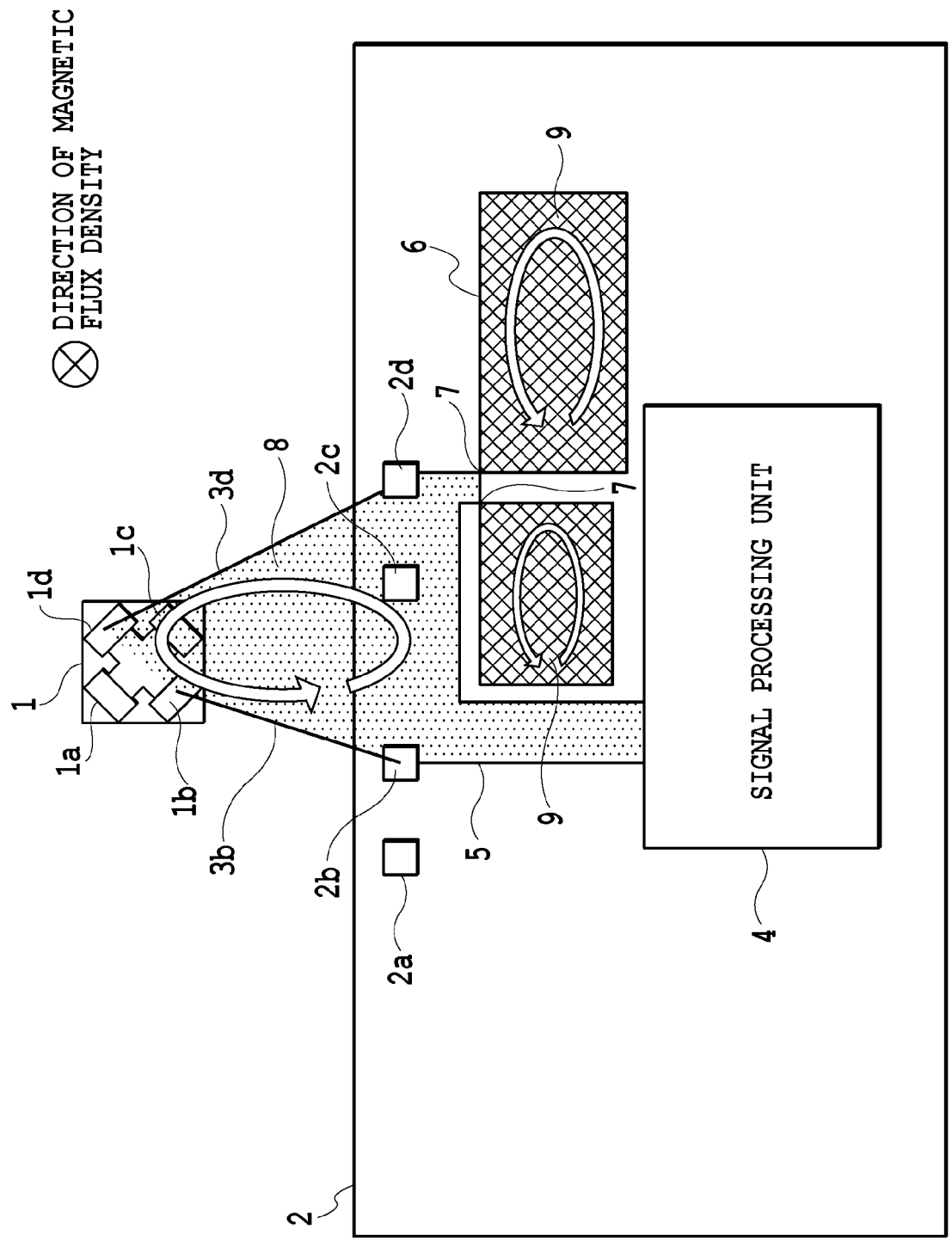
FIG. 9 is a third schematic diagram showing wire interconnections between a Hall-effect sensor and an IC configured to drive the Hall-effect sensor and perform signal processing therefor and also showing metal interconnections on the IC, according to the magnetic sensor of the present invention.

FIG. 9 is a third schematic view showing wire interconnections between a Hall-effect sensor and an IC configured to drive the Hall-effect sensor and perform signal processing therefor and also showing metal interconnections on the IC, according to the magnetic sensor of the present invention. As shown in FIG. 9, the IC may have multiple grade-separation junction portions 7 at each of which the second metal interconnection 6 on the IC crosses itself at different heights. The grade-separation junction portion 7 is a grade-separation junction, or interchange, for forming multiple loops on the IC for cancelling the induced electromotive force generated at the wire interconnections 3*b*, 3*d* and the like. Of course, multiple loops are formed by use of a multiple metal interconnection layers. Further the wire interconnections may include multiple grade-separation junction portions 7 at each of which only the first metal interconnection 5 on the IC crosses itself at different heights.

Figure 10:
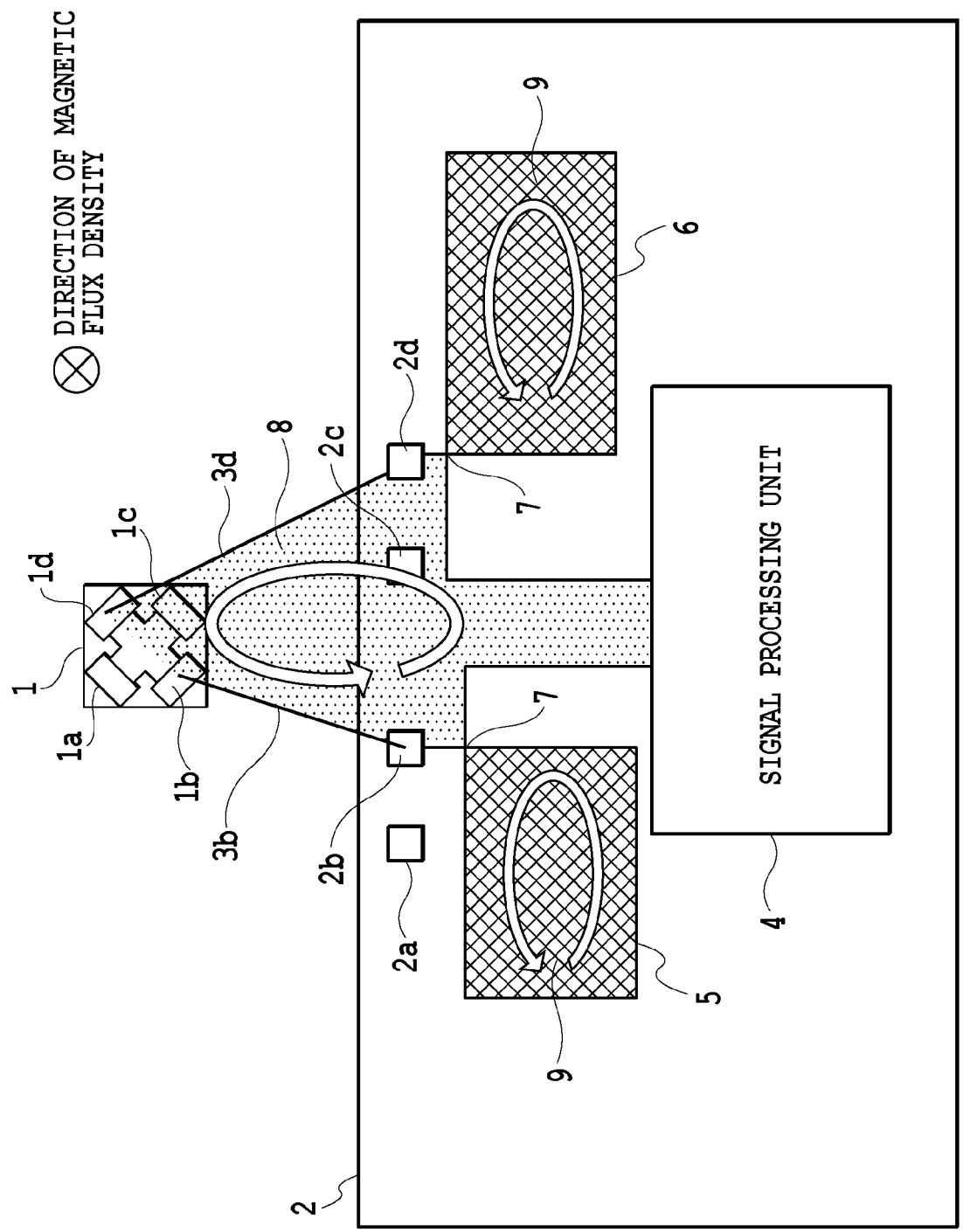
FIG. 10 is a fourth schematic diagram showing wire interconnections between a Hall-effect sensor and an IC configured to drive the Hall-effect sensor and perform signal processing therefor and also showing metal interconnections on the IC, according to the magnetic sensor of the present invention.

FIG. 10 is a fourth schematic view showing wire interconnections between a Hall-effect sensor and an IC configured to drive the Hall-effect sensor and perform signal processing therefor and also showing metal interconnections on the IC, according to the magnetic sensor of the present invention. As shown in FIG. 10, the IC may have grade-separation junction portions 7 at which the first metal interconnection 5 and the second metal interconnection 6 on the IC cross themselves separately at different heights. The grade-separation junction portion 7 is a grade-separation junction, or interchange, for forming multiple loops on the IC for cancelling the induced electromotive force generated at the wire interconnections 3*b*, 3*d* and the like. Of course, each of the first metal interconnection 5 and the second metal interconnection 6 may have multiple loops. Further, the multiple loops may be formed by use of multiple metal interconnection layers. It is needless to say that the IC may have multiple grade-separation junction portions at each of which the first metal interconnection 5 and the second metal interconnection 6 on the IC cross themselves at different heights.

FIG. 10 is a fourth schematic view showing wire interconnections between a Hall-effect sensor and an IC configured to drive the Hall-effect sensor and perform signal processing therefor and also showing metal interconnections on the IC, according to the magnetic sensor of the present invention. As shown in FIG. 10, the IC may have grade-separation junction portions 7 at which the first metal interconnection 5 and the second metal interconnection 6 on the IC cross themselves separately at different heights. The grade-separation junction portion 7 is a grade-separation junction, or interchange, for forming multiple loops on the IC for cancelling the induced electromotive force generated at the wire interconnections 3b, 3d and the like. Of course, each of the first metal interconnection 5 and the second metal interconnection 6 may have multiple loops. Further, the multiple loops may be formed by use of multiple metal interconnection layers. It is needless to say that the IC may have multiple grade-separation junction portions at each of which the first metal interconnection 5 and the second metal interconnection 6 on the IC cross themselves at different heights.

It desirable that the width of each metal interconnection, the distance between the metal interconnections, the number of grade-separation junction portions, and the dielectric constant of each layer are appropriately optimized so that a parasitic capacitance generated by the interconnections when the first metal interconnection 5 and the second metal interconnection 6 on the IC are close to each other at the grade-separation junction portion or the like may be suppressed within such a range as not to influence the output response of the magnetic sensor. For example, it is possible to select a structure for reducing the parasitic capacitance due to the interconnections by forming the first metal interconnection 5 on the IC by use of an uppermost one of the metal interconnection layers and forming the second metal interconnection 6 on the IC by use of a lowermost one of the metal interconnection layers.

It is shown from above that the present invention can provide a magnetic sensor in which a Hall-effect sensor configured to detect magnetism and an IC configured to drive the Hall-effect sensor and perform signal processing therefor are sealed in one package, the magnetic sensor suppressing an influence of an induced electromotive force generated by a drastic change in the magnetic flux density and being able to achieve response performance required for a current sensor.

Concrete examples are described below. It should be noted, however, that the present invention is not limited to those examples.

Example 1

A description is given for arranging and designing the interconnection loop so that the total area of an interconnection loop contributing to an induced electromotive force of the same polarity as that of output voltage of the Hall-effect sensor is 0.567 mm² and the total area of an interconnection loop contributing to an induced electromotive force of the opposite polarity to that of the output voltage of the Hall-effect sensor is 0.566 mm². In Example 1, the difference in the loop area is 0.001 mm², and therefore the areas of the loops are almost equal to each other.

In Example 1, the Hall-effect sensor is a product equivalent to HG116C manufactured by Asahi Kasei Microdevices Corporation and is driven by a constant current Ic=1.5 mA, and the output voltage thereof is amplified 150 times by a signal processing IC. The sensitivity of the Hall-effect sensor is 0.25 mV/mT.

Figure 3:
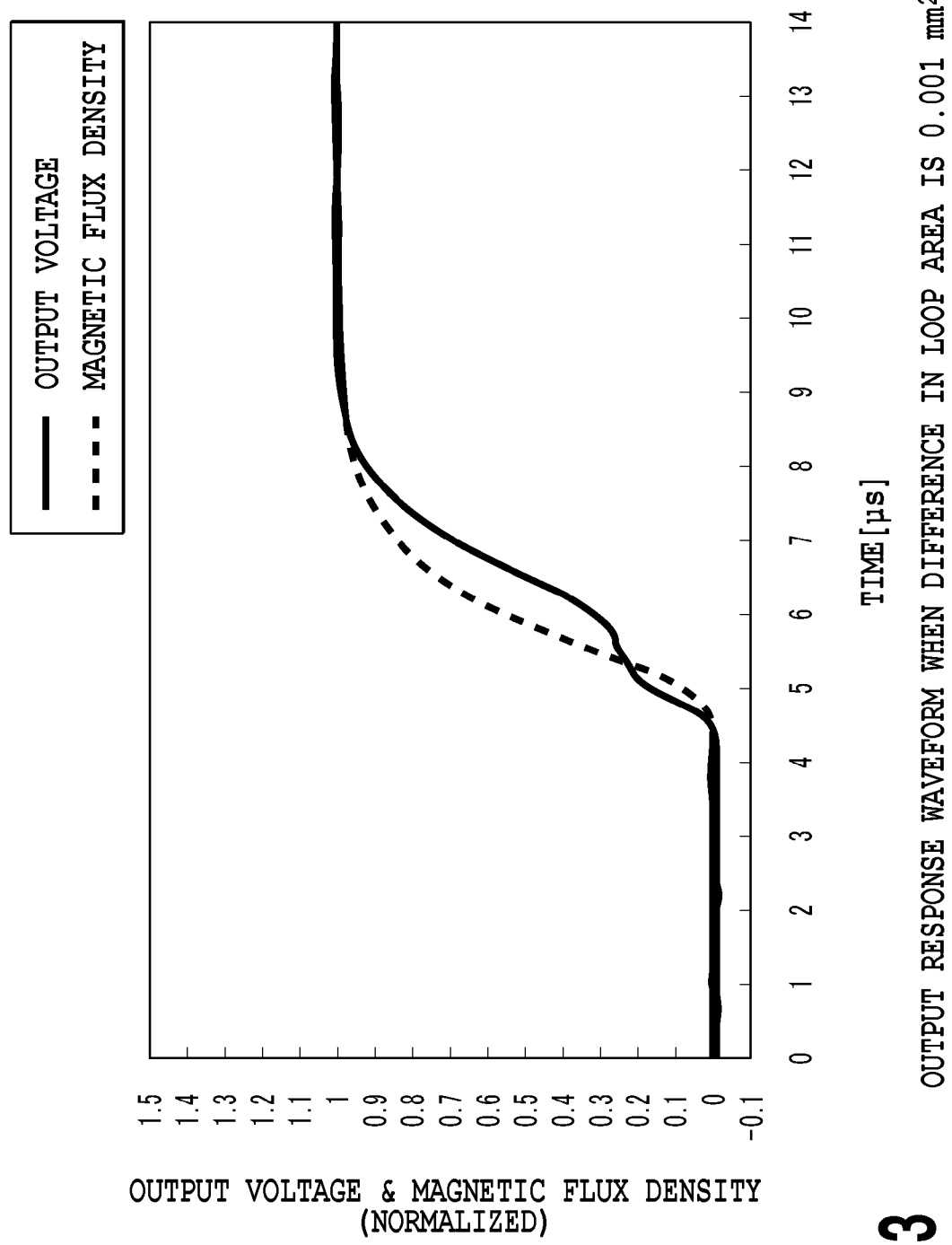
FIG. 3 is a diagram showing an output response waveform with respect to a magnetic field in a linear Hall-effect sensor IC of Example 1 of the present invention.

FIG. 3 is a diagram showing an output response waveform of magnetic flux density and output voltages with respect to a magnetic field applied in a linear Hall-effect sensor IC of Example 1 of the present invention. FIG. 3 shows a waveform for normalized output voltages of a sample linear Hall-effect IC fabricated with the conditions described above, the output voltages being observed when a magnetic field is applied to the linear Hall-effect sensor IC with a maximum rising change in the magnetic flux density of 39.7 mT/μs. The output voltages are normalized to output voltage stabilized. The maximum magnetic flux density applied in this experiment is $B_{max}$=71 mT.

It can be seen that, even when the magnetic flux density changes steeply, overshoot of the output voltage due to the induced electromotive force is almost 0%, and it takes 1 μs or less for the output voltage of the linear Hall-effect sensor IC to stabilize after the magnetic flux density applied stabilizes.

This result shows that the present invention can provide the magnetic sensor that suppresses an influence of an induced electromotive force generated due to a drastic change in the magnetic flux density and has a quick-response performance required for a current sensor. Specifically, the magnetic sensor includes a Hall-effect sensor configured to detect magnetism and an IC configured to drive the Hall-effect sensor and perform signal processing therefor, the IC having two or more metal interconnection layers. The Hall-effect sensor and the IC are electrically connected to each other via wire interconnections and are sealed in one package.

Comparative Example 1

Figure 4:
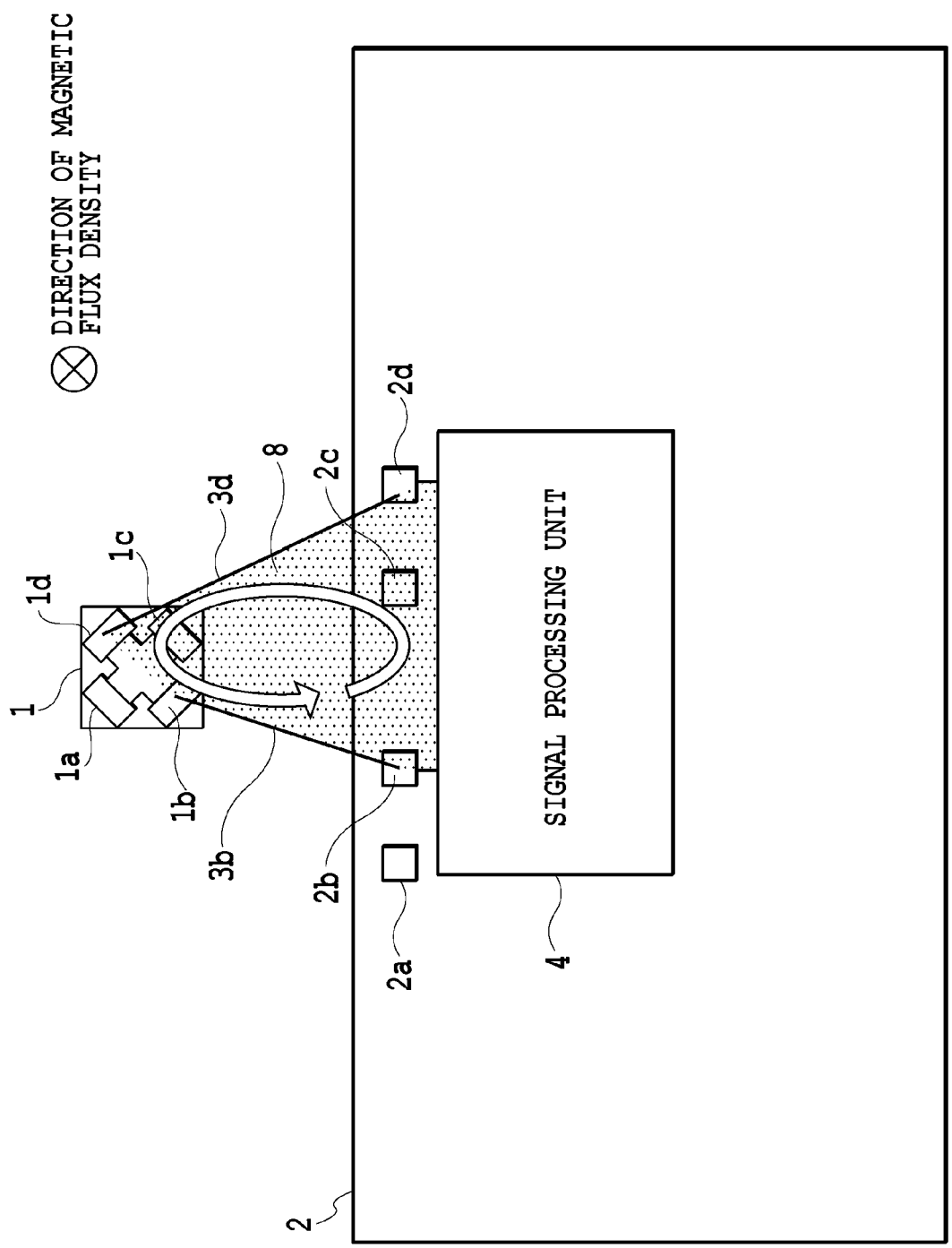
FIG. 4 is a schematic diagram showing wire interconnections between a Hall-effect sensor and an IC configured to drive the Hall-effect sensor and perform signal processing therefor and also showing metal interconnections on the IC chip, according to Comparative Example 1.

FIG. 4 is a schematic diagram showing wire interconnections between a Hall-effect sensor and an IC configured to drive the Hall-effect sensor and perform signal processing therefor and also showing metal interconnections on the IC chip, according to Comparative Example 1. Since the metal interconnections on the IC do not have the grade-separation junction portion, there is no interconnection loop contributing an induced electromotive force of the opposite polarity to that of output voltage of the Hall-effect sensor.

In Comparative Example 1, the Hall-effect sensor is a product equivalent to HG116C manufactured by Asahi Kasei Nicrodevices Corporation and is driven by a constant current Ic=1.5 mA, and the output voltage thereof is amplified 150 times by a signal processing IC. The sensitivity of the Hall-effect sensor is 0.25 mV/mT.

Figure 5:
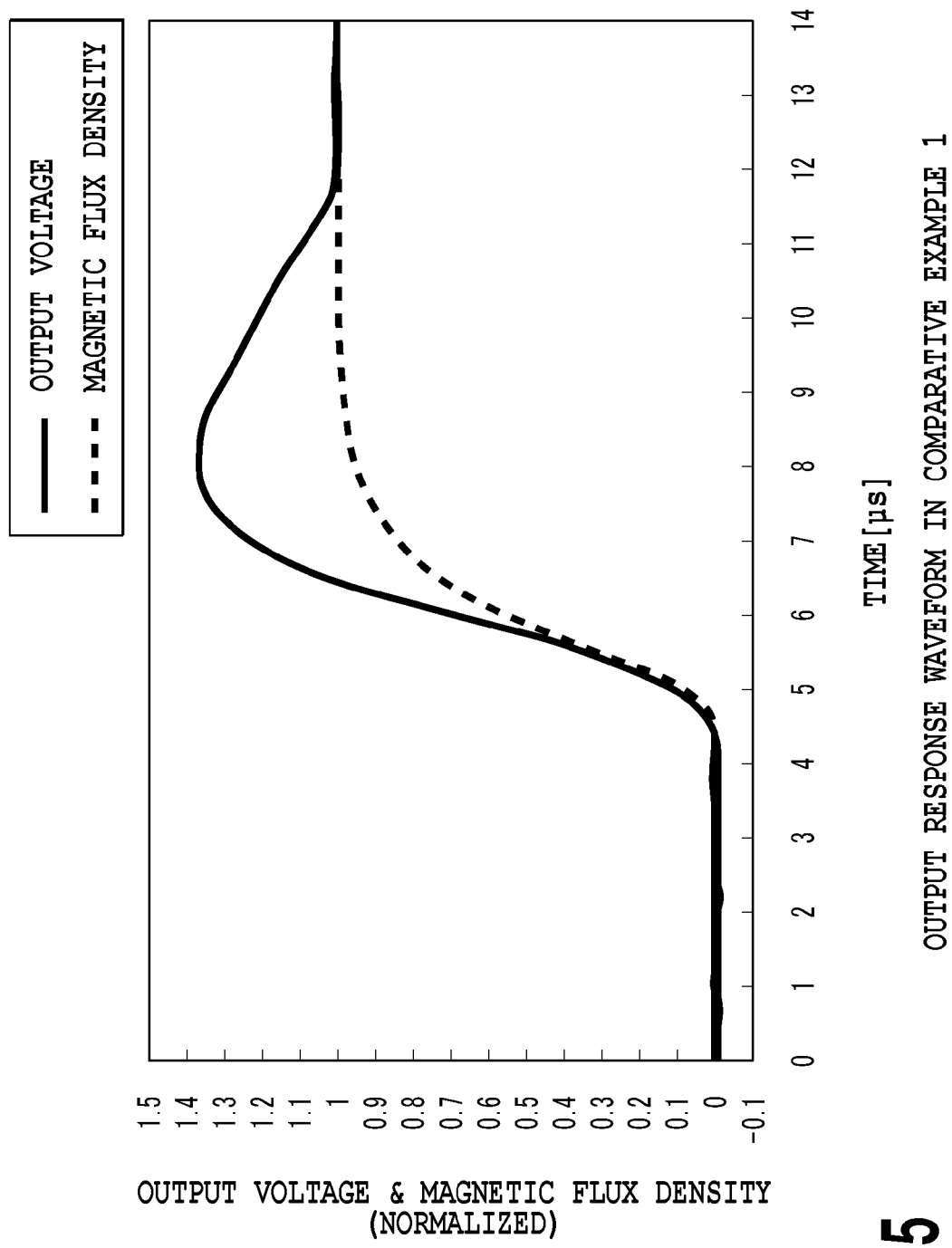
FIG. 5 is a diagram showing an output response waveform with respect to a magnetic field in a linear Hall-effect sensor IC of Comparative Example 1 shown in FIG. 4.

FIG. 5 is a diagram showing an output response waveform with respect to a magnetic field in a linear Hall-effect sensor IC of Comparative Example 1 shown in FIG. 4. FIG. 5 shows a waveform for normalized output voltages of a sample linear Hall-effect IC fabricated by use of Comparative Example 1, the output voltages being observed when a magnetic field is applied to the linear Hall-effect sensor IC with a maximum rising change in the magnetic flux density of 39.7 mT/μs. The output voltages are normalized to output voltage stabilized. The maximum magnetic flux density applied in this experiment is $B_{max}$=71 mT.

It can be seen, when the magnetic flux density changes steeply, overshoot of the output voltage due to an induced electromotive force is about 36%, and it takes 4 μs or more for the output voltage of the linear Hall-effect sensor IC to stabilize after the magnetic flux density applied stabilizes. This overshoot exceeds the acceptable value of 10% required for a current sensor, and therefore poses a problem.

The result of Comparative Example 1 shows that the present invention allows considerable suppression of an influence of an induced electromotive force and significant improvement in the response speed of the linear Hall-effect sensor IC.

Example 2

A description is given for arranging and designing the interconnection loop so that the total area of an interconnection loop contributing to an induced electromotive force of the same polarity as that of output voltage of the Hall-effect sensor is 0.629 mm² and the total area of an interconnection loop contributing to an induced electromotive force of the opposite polarity to that of output voltage of the Hall-effect sensor is 0.566 mm². In Example 2, the difference in the loop area is 0.063 mm².

In Example 2, the Hall-effect sensor is a product equivalent to HG116C manufactured by Asahi Kasei Microdevices Corporation and is driven by a constant current Ic=1.5 mA, and the output voltage thereof is amplified 150 times by a signal processing IC. The sensitivity of the Hall-effect sensor is 0.25 mV/mT.

Figure 6:
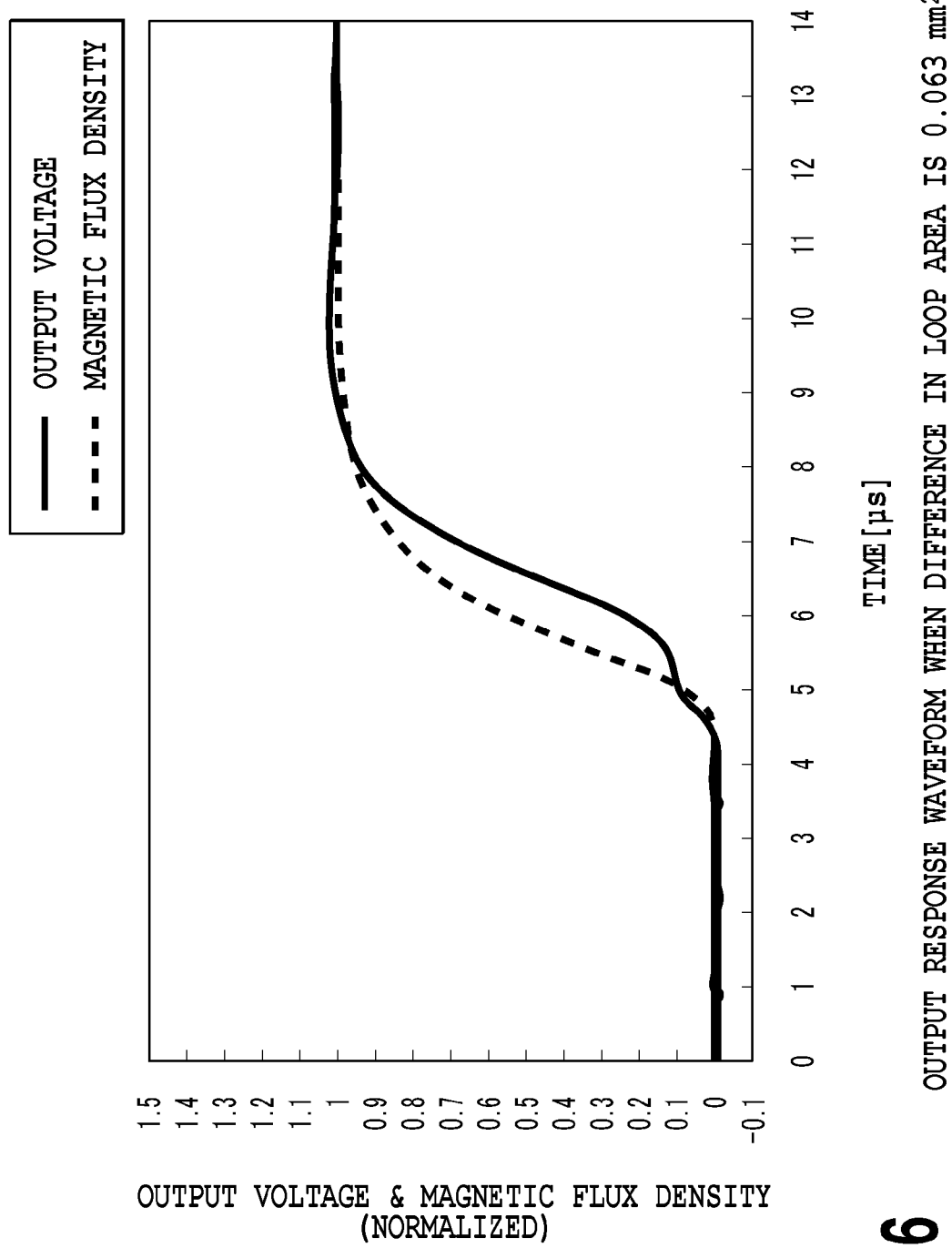
FIG. 6 is a diagram showing an output response waveform with respect to a magnetic field in a linear Hall-effect sensor IC of Example 2 of the present invention.

FIG. 6 is a diagram showing an output response waveform of magnetic flux density and output voltages with respect to a magnetic field applied in a linear Hall-effect sensor IC of Example 2 of the present invention. FIG. 6 shows a waveform for normalized output voltages of a sample linear Hall-effect IC fabricated with the conditions described above, the output voltages being observed when a magnetic field is applied to the linear Hall-effect sensor IC with a maximum rising change in the magnetic flux density of 39.7 mT/μs. The output voltages are normalized to output voltage stabilized. The maximum magnetic flux density applied in this experiment is $B_{max}$=71 mT.

These results show that, even when the magnetic flux density changes steeply in a case where there remains such an amount of induced electromotive force of the same polarity as output voltage of the Hall-effect sensor, overshoot of the output voltage due to the induced electromotive force is about 2%, and it takes 1 μs or less for the output voltage of the linear Hall-effect sensor IC to stabilize after the magnetic flux density applied stabilizes. Further, speed of response to the rising of the magnetic flux density is high when there remains an induced electromotive force of the same polarity as output voltage of the Hall-effect sensor. Thus, if the above percentage of overshoot is acceptable, depending on the applications, there are cases where it is better that an induced electromotive force component remains.

Example 3

A description is given for arranging and designing the interconnection loop so that, in FIG. 1, the total area of an interconnection loop contributing to the induced electromotive force of the same polarity as that of output voltage of the Hall-effect sensor is 0.735 mm² and the total area of an interconnection loop contributing to the induced electromotive force of the opposite polarity to that of output voltage of the Hall-effect sensor is 0.566 mm². In Example 2, the difference in the loop area is 0.169 mm².

In Example 3, the Hall-effect sensor is a product equivalent to HG116C manufactured by Asahi Kasei Microdevices Corporation and is driven by a constant current Ic=1.5 mA, and the output voltage thereof is amplified 150 times by a signal processing IC. The sensitivity of the Hall-effect sensor is 0.25 mV/mT.

Figure 7:
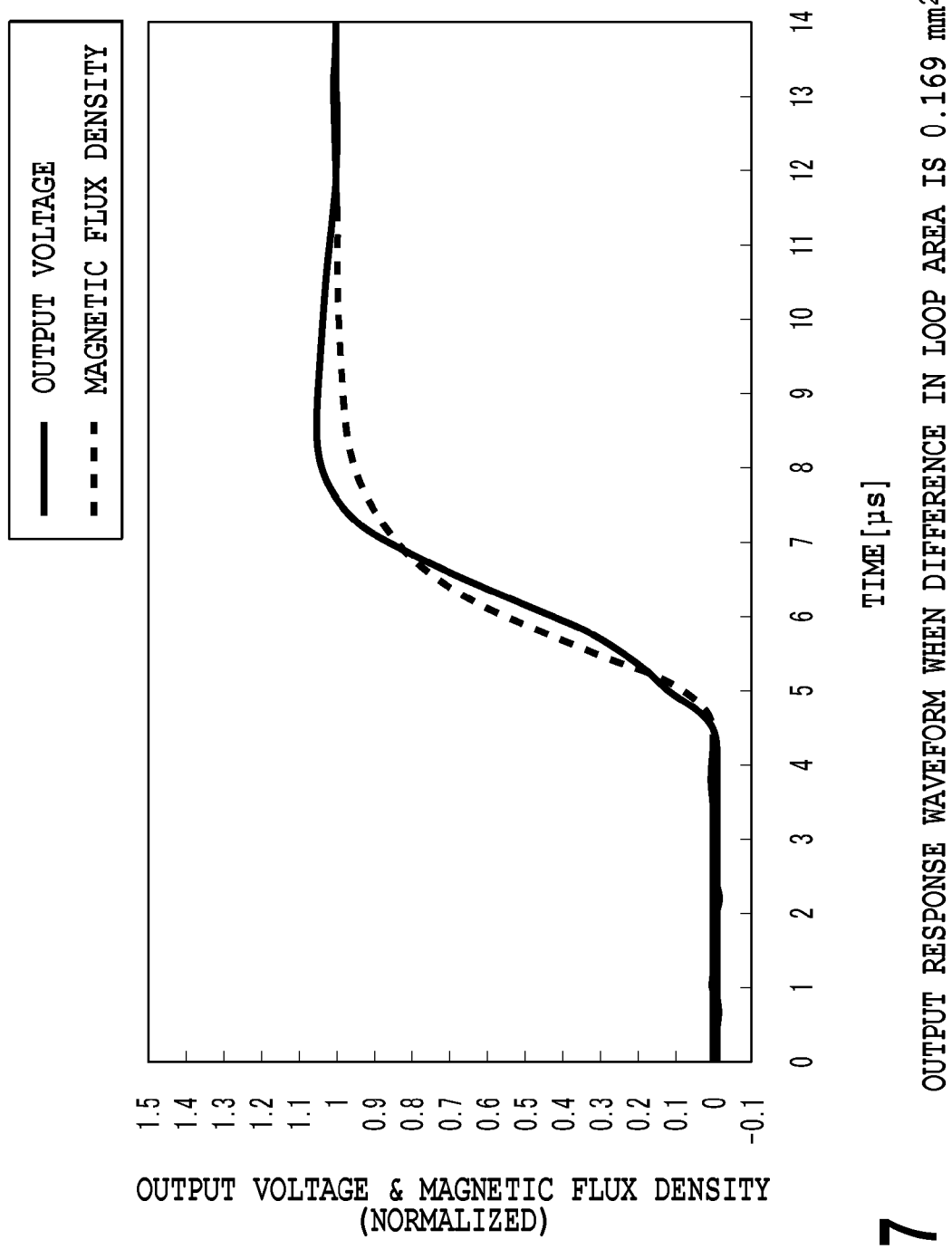
FIG. 7 is a diagram showing an output response waveform with respect to a magnetic field in a linear Hall-effect sensor IC of Example 3 of the present invention.

FIG. 7 is a diagram showing an output response waveform of magnetic flux density and output voltages with respect to a magnetic field applied in a linear Hall-effect sensor IC of Example 3 of the present invention. FIG. 7 shows a waveform for normalized output voltages of a sample linear Hall-effect IC fabricated with the conditions described above, the output voltages being observed when a magnetic field is applied to the linear Hall-effect sensor IC with a maximum rising change in the magnetic flux density of 39.7 mT/μs. The output voltages are normalized to output voltage stabilized. The maximum magnetic flux density applied in this experiment is $B_{max}$=71 mT.

It can be seen from the graph that, even when the magnetic flux density changes steeply, overshoot of the output voltage due to the induced electromotive force is about 5%, and it takes 2 μs or less for the output voltage of the linear Hall-effect sensor IC to stabilize after the magnetic flux density applied stabilizes.

These results show that the linear Hall-effect sensor IC can be used as a current sensor even if the induced electromotive force is not completely cancelled.

The following discusses a range within which the difference between the total area of a loop contributing to an induced electromotive force of the same polarity as that of output voltage of a Hall-effect sensor and the total area of a loop contributing to an induced electromotive force of the opposite polarity to that of the output voltage of the Hall-effect sensor should fall in order that the acceptable value of overshoot and undershoot of the output voltage of a current sensor may not exceed ±10%.

A Hall output voltage $V_{hall}$ is expressed in Formula 2 where $K_{hall}$ is the sensitivity of the Hall-effect sensor and $B_{max}$ is the maximum magnetic flux density applied to the linear Hall-effect sensor IC when the output voltage is stable.

[Expression 2]

$$V_{hall} = K_{hall} \times B_{max} \quad \text{(Formula 2)}$$

Since the formula to be satisfied is Formula 3,

[Expression 3]

$$-0.1 < \frac{V_{induction}}{V_{hall}} < 0.1. \quad \text{(Formula 3)}$$

From Formulae 1 to 3, Formula 4 below only has to be satisfied:

[Expression 4]

$$\frac{-0.1 \times K_{hall} \times B_{max}}{\frac{dB}{dt}} < \Delta S < \frac{0.1 \times K_{hall} \times B_{max}}{\frac{dB}{dt}}. \quad \text{(Formula 4)}$$

The units of $V_{hall}$, $K_{hall}$, $B_{max}$, and $\Delta S$ are [V], {V·m²Wb}, [Wb/m²], and [m²], respectively.

$\Delta S$ in Formula 4 is the difference between the total area of an interconnection loop contributing to an induced electromotive force of the same polarity as that of output voltage of the Hall-effect sensor and the total area of an interconnection loop contributing to an induced electromotive force of the opposite polarity to that of the output voltage of the Hall-effect sensor. In addition, as a derivative dB/dt of the magnetic flux density in FIG. 4, a value immediately before the magnetic flux density stabilizes should preferably be used.

INDUSTRIAL APPLICABILITY

The present invention relates to a magnetic sensor having quick-response performance and used as a current sensor or the like. The magnetic sensor of the present invention includes a Hall-effect sensor configured to detect magnetism and an IC configured to drive the Hall-effect sensor and perform signal processing therefor, and at the state of the Hall-effect sensor and the IC being electrically connected to each other via wire interconnections and sealed in one package, the present invention can achieve the magnetic sensor suppressing an influence of an induced electromotive force due to a drastic change in the magnetic flux density and having a fast-response performance required for a current sensor.

REFERENCE SIGNS LIST

1 Hall-effect sensor
1a to 1d electrode pad of Hall-effect sensor
2 IC for driving sensor and performing signal processing
2a to 2d electrode pad on IC
3a to 3d wire interconnection
4 signal processing unit for output of Hall-effect sensor, placed on IC
5 first metal interconnection
6 second metal interconnection
7 grade-separation junction portion
8, 9 interconnection loop area

The invention claimed is:
1. A magnetic sensor, comprising:
a Hall-effect sensor including a first output electrode pad and a second output electrode pad;
an IC including a first Hall output electrode pad, a second Hall output electrode pad, a signal processing unit, a first metal interconnection connecting the first Hall output electrode pad and the signal processing unit, and a second metal interconnection connecting the second Hall output electrode pad and the signal processing unit;
a first wire interconnection connecting the first output electrode pad of the Hall-effect sensor and the first Hall output electrode pad of the IC; and
a second wire interconnection connecting the second output electrode pad of the Hall-effect sensor and the second Hall output electrode pad of the IC, wherein
the first metal interconnection and the second metal interconnection are formed on the IC such that when the first and second metal interconnections are projected on a plane parallel to a magneto-sensitive surface of the Hall-effect sensor, (1) at least one of the projected first metal interconnection and the projected second metal interconnection crosses itself on the plane, or (2) the projected first metal interconnection and the projected second metal interconnection cross each other on the plane.

2. The magnetic sensor according to claim 1, wherein a plurality of loops are formed when the first and second output electrode pads of the Hall-effect sensor, the first and second wire interconnections, the first and second Hall output electrode pads of the IC, the signal processing unit of the IC, and the first and second metal interconnections of the IC are projected on a plane parallel to a magneto-sensitive surface of the Hall-effect sensor, at least one loop from the plurality of loops generating an induced electromotive force of the same polarity as that of an output voltage of the Hall-effect sensor, and at least one loop from the plurality of loops generating an induced electromotive force of an opposite polarity as that of the output voltage of the Hall-effect sensor.

3. The magnetic sensor according to claim 2, wherein a total area of a loop from the plurality of loops that generates an induced electromotive force of the same polarity as that of the output voltage of the Hall-effect sensor is equal to a total area of a loop from the plurality of loops that generates an induced electromotive force of an opposite polarity as that of the output voltage of the Hall-effect sensor.

4. The magnetic sensor according to claim 2, wherein an absolute value of a difference [unit: $m^2$] between a total area of any loop from the plurality of loops that generates an induced electromotive force of the same polarity as that of the output voltage of the Hall-effect sensor and a total area of any loop from the plurality of loops that generates an induced electromotive force of an opposite polarity as that of the output voltage of the Hall-effect sensor is not larger than a value [unit: $m^2$] obtained by dividing a product of (1) 0.1, (2) a sensitivity of a Hall-effect element [unit: $V \cdot m^2/Wb$], and (3) a maximum magnetic flux density applied [unit: $Wb/m^2$], by a time derivative [unit: $Wb/m^2 \cdot s$] of a magnetic flux density applied.

5. The magnetic sensor according to claim 1, wherein at least one of the first metal interconnection and the second metal interconnection is formed by use of two or more metal interconnection layers.

6. The magnetic sensor according to claim 1, wherein a polarity total induced electromotive force generated by a change in a magnetic flux density externally applied is the same as a polarity of an output voltage of the Hall-effect sensor.

7. The magnetic sensor according to claim 1, wherein it takes 2 μs or less for an output voltage of the Hall-effect sensor to stabilize after a magnetic flux density applied to the magnetic sensor stabilizes.

8. The magnetic sensor according to claim 1, wherein the Hall-effect sensor is made of a compound semiconductor.

9. The magnetic sensor according to claim 1, wherein the first metal interconnection is formed by use of an uppermost metal interconnection layer from a plurality of metal interconnection layers on the IC, and the second metal interconnection is formed by use of a lowermost metal interconnection layer from the plurality of metal interconnection layers on the IC.

* * * * *